(12) United States Patent
Park

(10) Patent No.: US 7,271,439 B2
(45) Date of Patent: Sep. 18, 2007

(54) SEMICONDUCTOR DEVICE HAVING PAD STRUCTURE FOR PREVENTING AND BUFFERING STRESS OF SILICON NITRIDE FILM

(75) Inventor: Sun Kee Park, Gyeongsangbuk-do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/879,840

(22) Filed: Jun. 29, 2004

(65) Prior Publication Data
US 2005/0133854 A1 Jun. 23, 2005

(30) Foreign Application Priority Data
Dec. 19, 2003 (KR) ............... 10-2003-0093726

(51) Int. Cl.
*H01L 29/76* (2006.01)
*H01L 29/94* (2006.01)
*H01L 31/062* (2006.01)
*H01L 31/119* (2006.01)
*H01L 27/01* (2006.01)

(52) U.S. Cl. ............ 257/327; 257/459; 257/E23.02; 257/E21.122; 438/183

(58) Field of Classification Search ......... 257/503, 257/750, 306, 412, 915, 311, 327, 459, E23.02, 257/E21.122; 438/238, 745, 183
See application file for complete search history.

(56) References Cited

U.S. PATENT DOCUMENTS

| 5,998,249 | A  | * | 12/1999 | Liaw et al. | 438/238 |
|---|---|---|---|---|---|
| 6,150,689 | A  | * | 11/2000 | Narui et al. | 257/306 |
| 6,384,464 | B1 | * | 5/2002 | Shin | 257/503 |
| 6,731,007 | B1 | * | 5/2004 | Saito et al. | 257/762 |
| 2001/0045651 | A1 | * | 11/2001 | Saito et al. | 257/750 |
| 2003/0148625 | A1 | * | 8/2003 | Ho et al. | 438/745 |

FOREIGN PATENT DOCUMENTS

| KR | 1020020058235 A | 7/2002 |
|---|---|---|
| KR | 1020030025061 A | 3/2003 |

* cited by examiner

*Primary Examiner*—Andy Huynh
*Assistant Examiner*—Tram H Nguyen
(74) *Attorney, Agent, or Firm*—Marshall, Gerstein & Borun LLP

(57) ABSTRACT

The present invention discloses a semiconductor device having a pad structure for preventing a stress of a silicon nitride film. The semiconductor device includes a semiconductor substrate, a lower structure formed on the semiconductor substrate, a first insulation film formed on the lower structure, a first metal layer coupled to the lower structure through a first metal contact in the first insulation film, a second metal layer formed on the first metal layer, and a plurality of dummy gates having a concentric square structure formed at the lower portion of the pad region on the second metal layer.

16 Claims, 7 Drawing Sheets

120, PR   106, 112, 116

SEMICONDUCTOR DEVICE HAVING PAD STRUCTURE FOR PREVENTING AND BUFFERING STRESS OF SILICON NITRIDE FILM

BACKGROUND

1. Field of the Invention

The present invention relates to a semiconductor device, and more particularly to, a pad structure for relieving a stress applied to a barrier insulation film of a semiconductor device.

2. Discussion of Related Art

In general, all semiconductor memory devices manufactured by using silicon wafers have a pad structure. The pad structure opens a part of a passivation layer on an upper metal layer such as a second metal layer, thereby exposing the upper metal layer. The pad structure is operated as a connection means installed between the inside and outside of the semiconductor device, for supplying a voltage to the semiconductor device and inputting or outputting a data to/from the semiconductor device according to a wire bonding process. The pad structure is one of the major factors that must be considered in manufacturing of the semiconductor device. In the case that the pad structure of the semiconductor device is not reliable, the semiconductor device is not usable.

The pad structure must satisfy the following conditions. First, the pad structure must be formed to minimize a pad stress. The pad stress seriously reduces the adhesive strength of the wire bonding and causes pad lifting. Second, the pad structure must be formed to maximize a wire bonding strength. Third, the pad structure must be formed to minimize a pad capacitance. If the pad capacitance exists, the semiconductor device may be deteriorated due to the data inputted/outputted through the pad at a speed of a few ns (nano second), and the wire bonding may be separated. The disadvantages of the conventional pad structure will now be explained in detail with reference to FIG. 1.

FIG. 1 is a cross-sectional diagram illustrating a pad structure of a conventional semiconductor device in a back-end process of a NAND flash memory device. FIG. 2 is a partial layout diagram illustrating the conventional semiconductor device having the pad structure of FIG. 1. FIG. 3 is a state diagram illustrating state variations of a silicon nitride film by influences of a thermal stress in the pad structure of the conventional semiconductor device.

Referring to FIG. 1, the pad structure in the back-end process of the NAND flash memory device has a sequentially-stacked structure of a semiconductor substrate 102, a field oxide film 104, a silicon nitride film 106 for a self aligned contact, a first interlayer insulation film 108, a first metal layer 110, a trench stop silicon nitride film 112, an insulation film 114 for a trench, a second metal contact stop silicon nitride film 116, a second interlayer insulation film 118 and a second metal layer 120. Three layers, namely, the silicon nitride film 106 for the self aligned contact, the trench stop silicon nitride film 112 and the second metal contact stop silicon nitride film 116 are silicon nitride films. The silicon nitride films 106, 112 and 116 are used as barrier layers in an etching process by using a select ratio of an oxide to a nitride. As shown in FIG. 2, in the pad structure, the silicon nitride films 106, 112 and 116 are coupled over the outside of a pad region PR formed by partially exposing the second metal layer 120 as well as the inside of the pad region PR, to cover the whole chip.

On the other hand, the silicon nitride film has different thermal properties from those of the upper and lower layers. That is, as compared with a layer including an oxide or polysilicon oxide, the silicon nitride film shows a very high thermal stress. For example, a thermal stress constant of the oxide film $SiO_2$ is $2~4 \times 10^9$ dyne/cm$^2$, and a thermal stress constant of the silicon nitride film $Si_3N_4$ is $9~10 \times 10^9$ dyne/cm$^2$. Therefore, the thermal stress constant of $Si_3N_4$ is larger than that of $SiO_2$ by about 2.5 to 4.5 times.

As depicted in FIG. 3, such thermal stress differences cause lifting between the lower layers 104, 108 and 114 including oxides and the upper layers 106, 112 and 116 including nitrides. In the case that $Si_3N_4$ is coupled to a first metal contact, a second metal contact and a first metal layer, if $Si_3N_4$ is lifted due to a high stress, the first metal contact, the second metal contact or the first metal layer may be opened. That is, when the silicon nitride film is excessively exposed to the thermal stress, the silicon nitride film is lifted, and thus reliability of the device is seriously reduced. Especially, the structural portion of the pad influenced by the thermal properties of the silicon nitride film in the NAND flash memory device is the adjacent portion between the trench stop silicon nitride film 112 and the second metal contact stop silicon nitride film 116. Accordingly, the stress for the silicon nitride film in that portion must be relieved in the back-end process of the NAND flash memory device, and countermeasures therefor must be provided.

SUMMARY OF THE INVENTION

The present invention is achieved to solve the above problems. One object of the present invention is to provide a pad structure which can reduce a stress of a silicon nitride film in a back-end process of a semiconductor device.

Another object of the present invention is to provide a semiconductor device having a pad structure which can isolate a silicon nitride film incorporated with the inside and outside of a pad of the semiconductor device at the inside and outside of the pad.

One aspect of the present invention is to provide a semiconductor device, including: a semiconductor substrate; a lower structure formed on the semiconductor substrate; a first insulation film formed on the lower structure; a first metal layer coupled to the lower structure through a first metal contact in the first insulation film; a second metal layer formed on the first metal layer; and a plurality of inside dummy gates formed inside a pad region on the second metal layer.

Preferably, the inside dummy gates are formed in the shape of a plurality of concentric squares or a plurality of islands.

Preferably, a horizontal interval between the inside dummy gates and the edges of the pad region ranges from 0.3 to 3.0 μm.

Preferably, a width of the inside dummy gates ranges from 0.3 to 3.0 μm.

Preferably, an interval between the inside dummy gates ranges from 0.3 to 3.0 μm.

Preferably, the semiconductor device further includes an outside dummy gate for surrounding the pad region at a predetermined interval from the pad region outside the pad region.

Preferably, a width of the outside dummy gate ranges from 0.3 to 1.0 μm.

Preferably, a horizontal interval between the outside dummy gate and the pad region ranges from 2.0 to 5.0 μm.

Preferably, the semiconductor device further includes a first dummy metal contact etched in a line shape on the outside dummy gate outside the pad region.

Preferably, a width of the first dummy metal contact ranges from 0.2 to 0.4 μm.

Preferably, the first dummy metal contact is formed on the outside dummy gate.

According to another aspect of the present invention, a semiconductor device includes: a semiconductor substrate; a lower structure formed on the semiconductor substrate; a first insulation film formed on the lower structure; a first metal layer coupled to the lower structure through a first metal contact in the first insulation film; a second metal layer formed on the first metal layer; and first inside dummy metal layers formed inside a pad region on the second metal layer.

Preferably, the first inside dummy metal layers are formed in the shape of a mesh or a plurality of concentric squares.

Preferably, the semiconductor device further includes a plurality of inside dummy gates formed inside the pad region in the shape of a plurality of concentric squares or a plurality of islands.

Preferably, the inside dummy gates do not overlap with the first inside dummy metal layers.

Preferably, the inside dummy gates are separated by 0.5 to 3.0 μm when overlapping with the first inside dummy metal layers.

Preferably, the semiconductor device further includes an outside dummy gate for surrounding the pad region at a predetermined interval from the pad region outside the pad region.

Preferably, the semiconductor device further includes a first dummy metal contact formed in a line shape on the outside dummy gate outside the pad region.

Preferably, a width of the first inside dummy metal layers ranges from 0.2 to 1.0 μm.

Preferably, an interval between the first inside dummy metal layers ranges from 2.0 to 5.0 μm.

Preferably, the edges of the first inside dummy metal layers are aligned in the vertical direction to the edges of the pad region.

Preferably, the first inside dummy metal layers are inwardly formed at an interval of 0.5 to 2.0 μm from the edges of the second metal layer.

Preferably, the semiconductor device further includes a first outside dummy metal layer for surrounding the pad region in a line shape outside the pad region, and a second dummy metal contact formed on the first outside dummy metal layer.

Preferably, a width of the first outside dummy metal layer ranges from 0.5 to 1.0 μm.

Preferably, a width of the second dummy metal contact ranges from 0.20 to 0.50 μm.

Preferably, the semiconductor device further includes a second dummy metal layer formed on the second dummy metal contact. Here, an interval between the second dummy metal layer and the second metal layer ranges from 3.0 to 10.0 μm.

Preferably, a width of the second dummy metal layer ranges from 0.5 to 1.0 μm.

Preferably, a horizontal interval between the first dummy metal contact and the second dummy metal contact ranges from 1.0 to 5.0 μm.

DETAILED DESCRIPTION OF PREFERRED EMBODIMENTS

Figure 1:
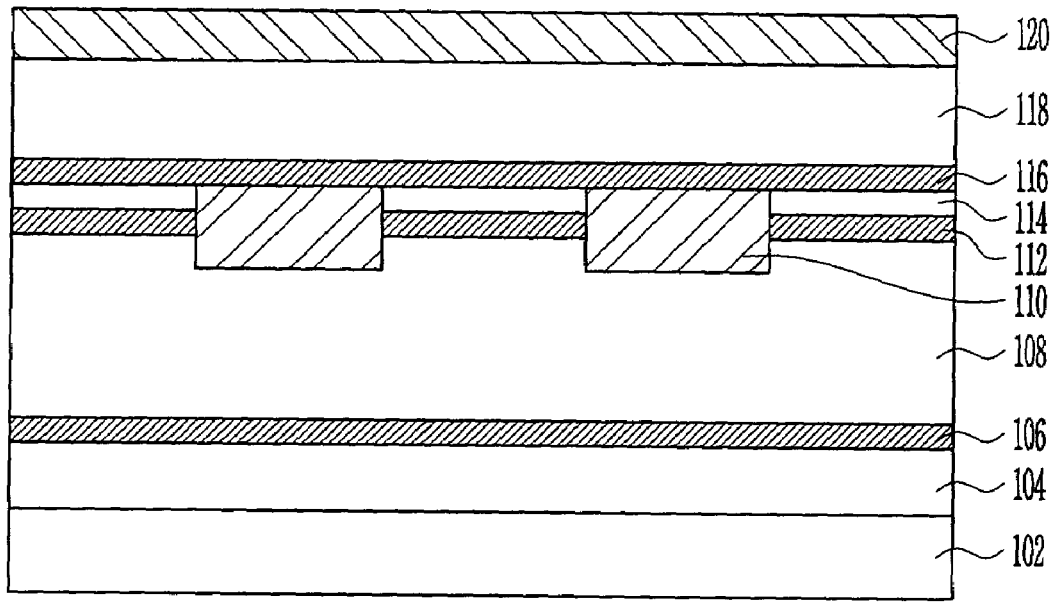
FIG. 1 is a cross-sectional diagram illustrating a pad structure of a conventional semiconductor device in a back-end process of a NAND flash memory device.
Figure 2:
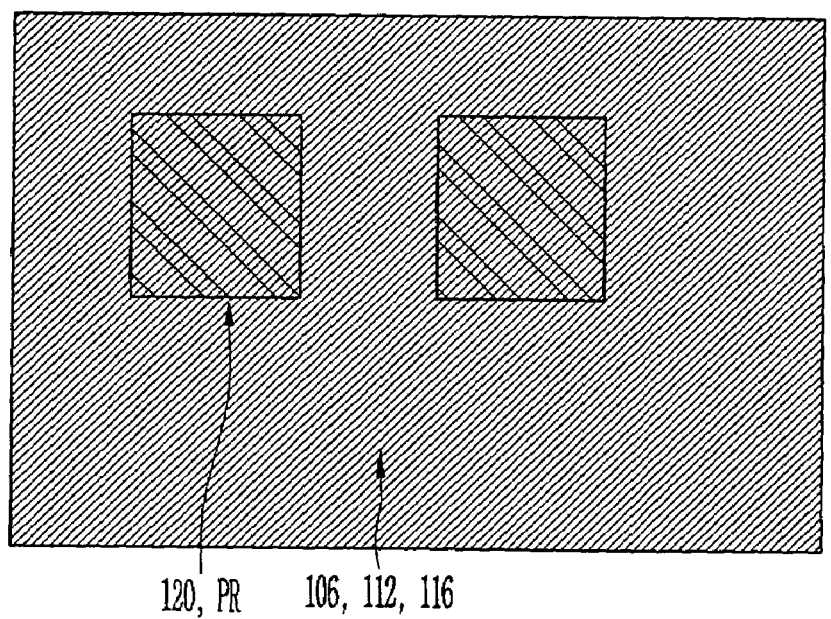
FIG. 2 is a partial layout diagram illustrating the conventional semiconductor device having the pad structure of FIG. 1.
Figure 3:
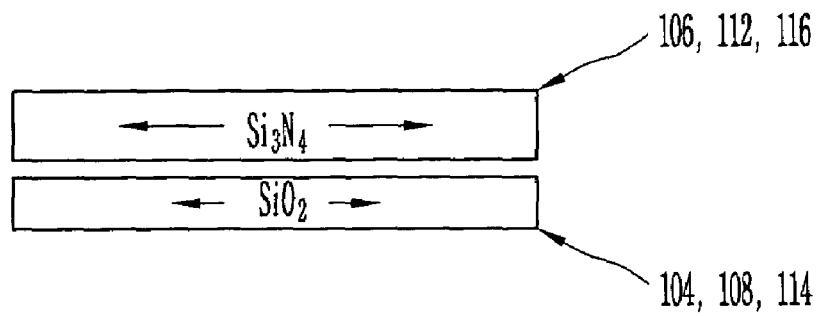
FIG. 3 is a state diagram illustrating state variations of a silicon nitride film by influences of a thermal stress in the pad structure of the conventional semiconductor device.

A semiconductor device having a pad structure for preventing and buffering a stress of a silicon nitride film in accordance with preferred embodiments of the present invention will now be described in detail with reference to the accompanying drawings.

In the case that it is described that one film is disposed 'on' another film or a semiconductor substrate, one film can directly contact another film or the semiconductor substrate, or the third film can be positioned between them. In the drawings, a thickness or size of each layer is exaggerated to provide clear and accurate explanations. Wherever possible, the same reference numerals will be used throughout the drawings and the description to refer to the same or like parts.

Figure 4:
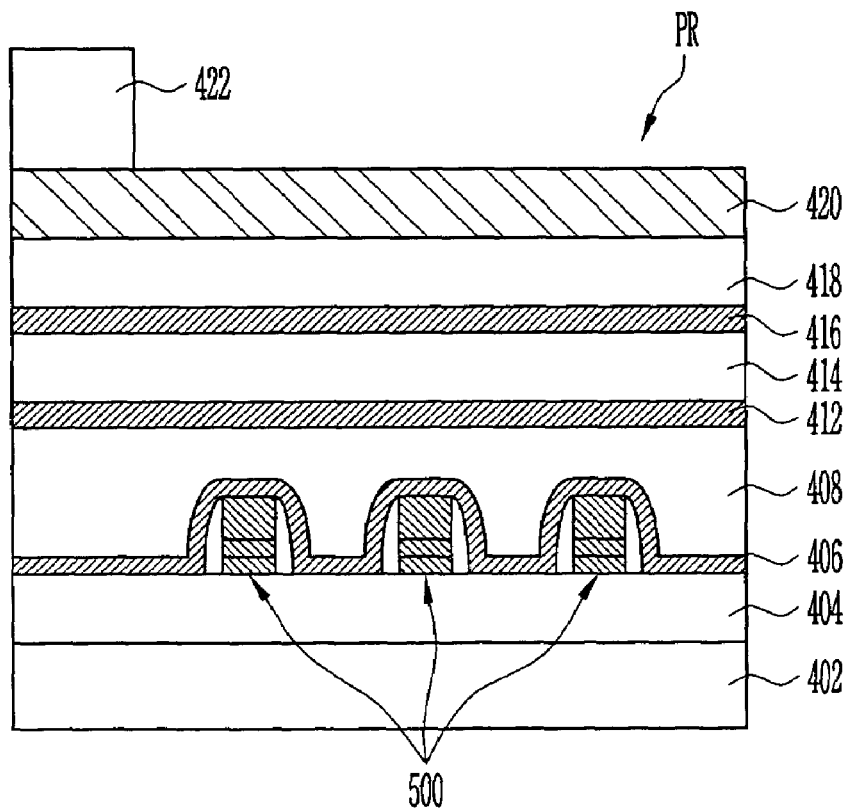
FIG. 4 is a partial cross-sectional diagram illustrating a semiconductor device having a pad structure for preventing and buffering a stress of an insulation film in accordance with a first embodiment of the present invention.
Figure 5:
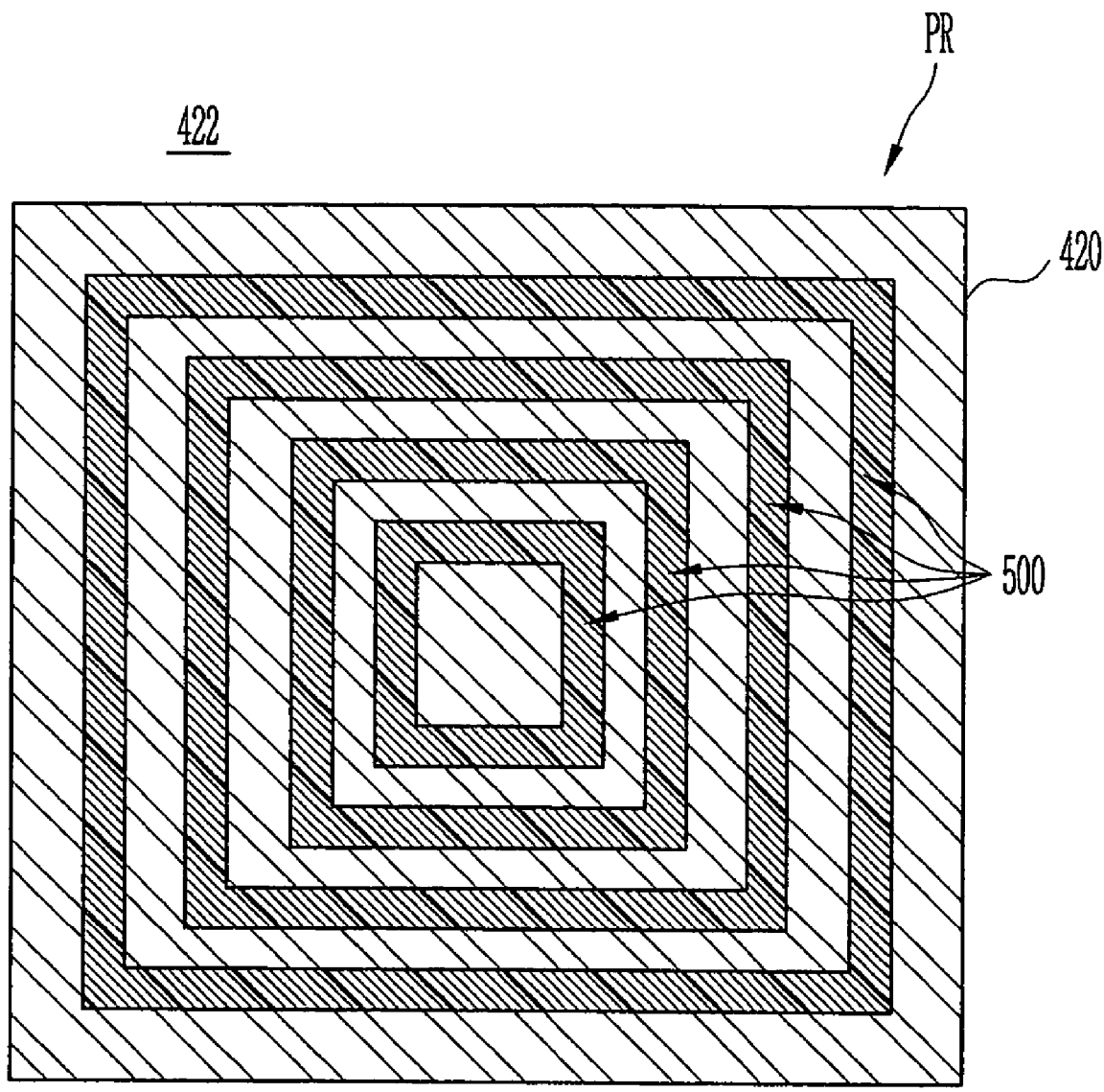
FIG. 5 is a layout diagram illustrating the pad structure of the semiconductor device of FIG. 4.

FIG. 4 is a partial cross-sectional diagram illustrating a semiconductor device having a pad structure for preventing and buffering a stress of an insulation film in accordance with a first embodiment of the present invention. FIG. 5 is a layout diagram illustrating the pad structure of the semiconductor device of FIG. 4.

Referring to FIGS. 4 and 5, the pad structure of the semiconductor device includes a sequentially-stacked structure of a semiconductor substrate 402, a field oxide film 404, inside dummy gates 500, a silicon nitride film 406 for a self aligned contact, a first interlayer insulation film 408, a trench stop silicon nitride film 412, an insulation film 414 for a trench, a second metal contact stop silicon nitride film 416, a second interlayer insulation film 418, a second metal layer 420, and a protection layer 422 opening a pad region PR.

The field oxide film 404 is formed between transistor elements in order to prevent interferences between them. Generally, the field oxide film 404 is an isolation layer for isolating NMOS and PMOS regions and blocking a current. More broadly, the field oxide film 404 is a predetermined portion of a semiconductor substrate on which not elements but an oxide film has been formed.

The inside dummy gates 500 are simultaneously formed on the field oxide film 404 inside the pad region PR according to a process for forming a gate of an active element. Accordingly, the inside dummy gates 500 have a generally-used gate structure, namely a polycide structure in which polysilicon is formed on a gate oxide film and silicide is formed on the polysilicon.

As shown in FIG. 5, the inside dummy gates 500 have a concentric square structure. In accordance with the present invention, a thermal stress or mechanical stress applied to a pad during a predetermined process such as wire bonding is relieved by forming the inside dummy gates 500 having the concentric square structure inside the pad region PR. Although not illustrated, the inside dummy gates 500 can also be formed in the shape of a plurality of islands. Therefore, the silicon nitride film 406 for the self aligned contact is formed in an embossing or uneven shape by the inside dummy gates 500, and the thermal stress or mechanical stress is distributed in the curved portions.

In the inside dummy gates 500, the outermost square inside dummy gate 500 in the lower portion of the pad region PR is inwardly disposed at an interval of 0.3 to 3.0 μm from the edges of the pad region PR. It is a horizontal interval between the inside dummy gate 500 and the lower portion of the pad region PR. In addition, a width of the inside dummy gates 500 ranges from 0.3 to 3.0 μm, and an interval between the inside dummy gates 500 ranges from 0.3 to 3.0 μm. The position, width and interval of the inside dummy gates 500 can be appropriately controlled according to a height of the pad structure, composition of interlayer materials, and a size of the pad.

On the other hand, the silicon nitride film 406 for the self aligned contact, the first interlayer insulation film 408, the trench stop silicon nitride film 412, the insulation film 414 for the trench, the second metal contact stop silicon nitride film 416, the second interlayer insulation film 418, the second metal layer 420 and the protection layer 422 opening the pad region PR are formed in the same manner as the conventional process for manufacturing the semiconductor device. Accordingly, detailed explanations thereof are omitted.

As described above, in accordance with the present invention, in order to prevent and buffer the stress of the silicon nitride film 406 for the self aligned contact, the inside dummy gates 500 having the concentric square structure and the embossing structure are formed on the semiconductor substrate 402 inside the pad region PR. Preferably, the inside dummy gates 500 are formed on the field oxide film 404 on the semiconductor substrate 402.

Figure 6:
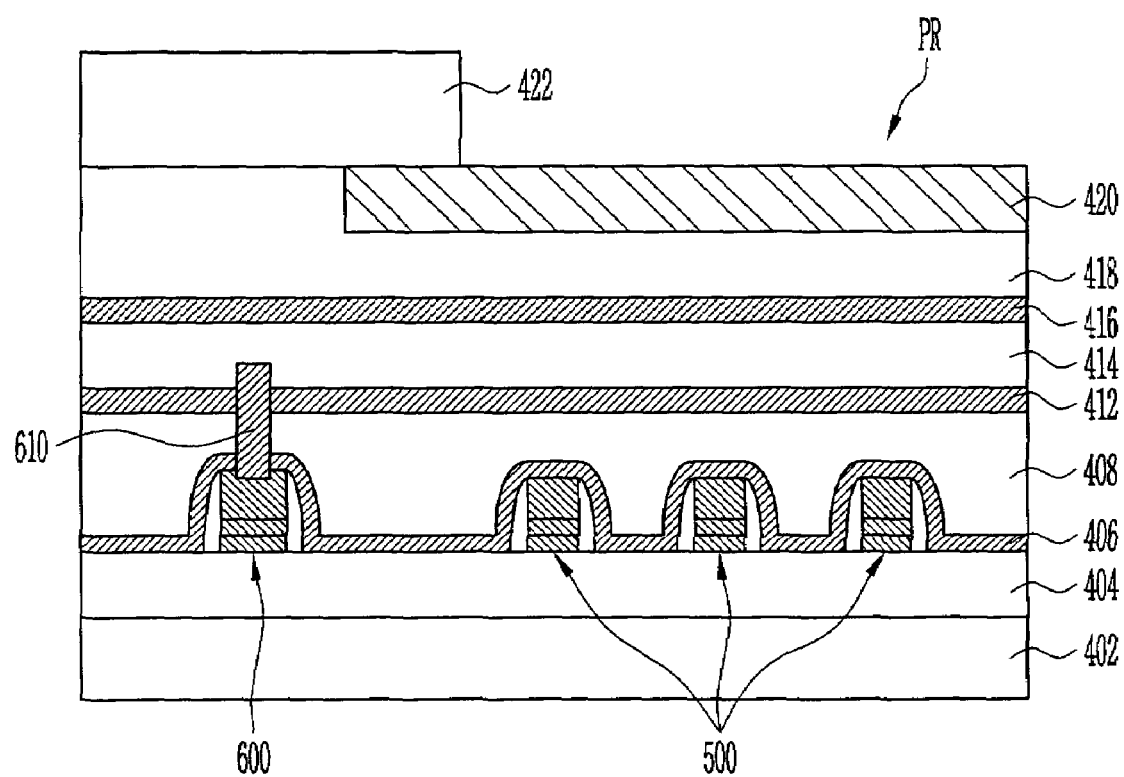
FIG. 6 is a partial cross-sectional diagram illustrating a semiconductor device having a pad structure for preventing and buffering a stress of an insulation film in accordance with a second embodiment of the present invention.
Figure 7:
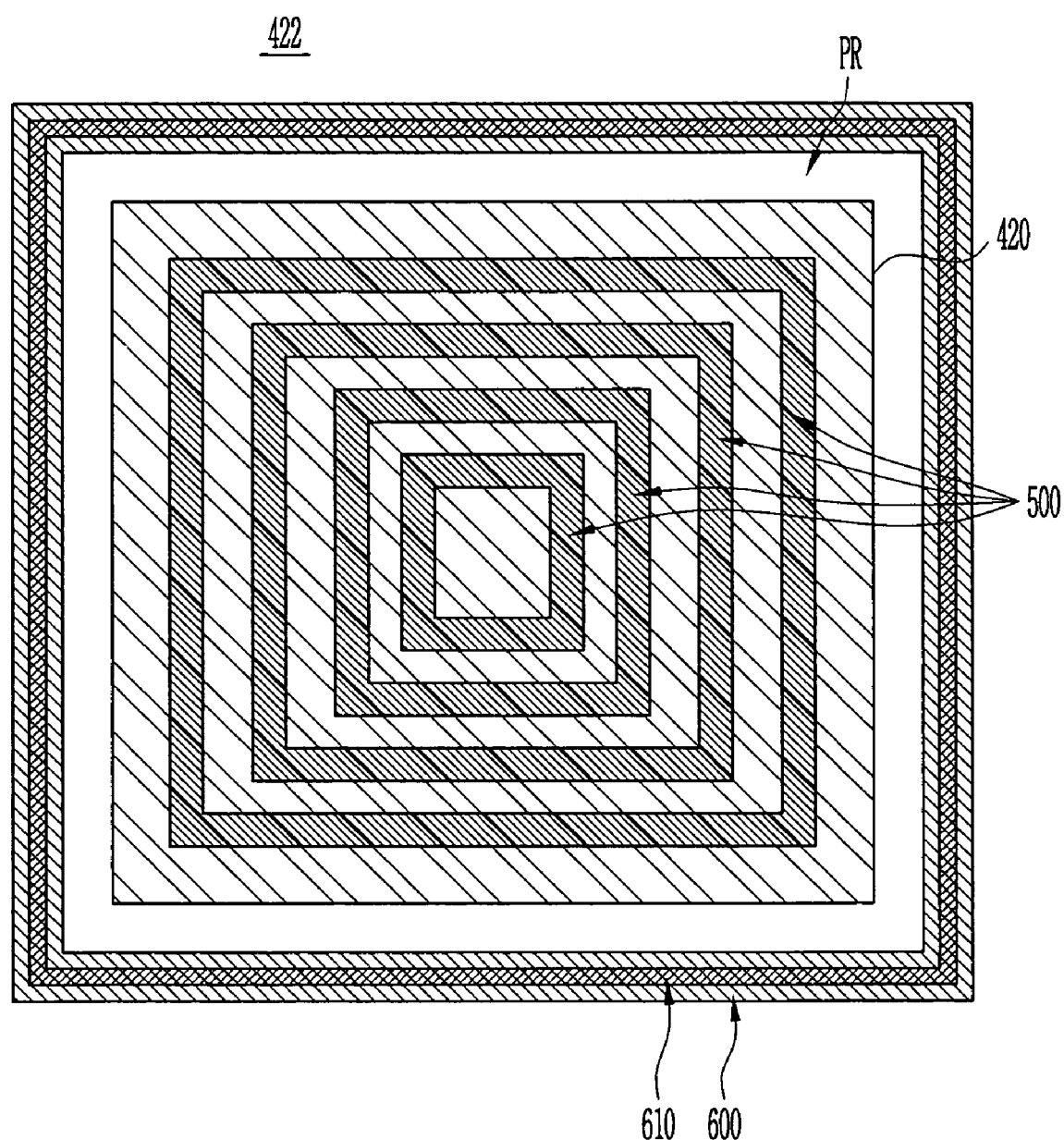
FIG. 7 is a layout diagram illustrating the pad structure of the semiconductor device of FIG. 6.

FIG. 6 is a partial cross-sectional diagram illustrating a semiconductor device having a pad structure for preventing and buffering a stress of an insulation film in accordance with a second embodiment of the present invention, and FIG. 7 is a layout diagram illustrating the pad structure of the semiconductor device of FIG. 6.

As illustrated in FIGS. 6 and 7, the pad structure of the semiconductor device has the same structure as that of FIGS. 4 and 5, namely the inside dummy gates 500 having the concentric square structure including a different size of squares in an embossing shape on the field oxide film 404 on the semiconductor substrate 402 inside the pad region PR, and further includes an outside dummy gate 600 formed outside the pad region PR, and a first dummy metal contact 610 formed on the outside dummy gate 600.

The outside dummy gate 600 is formed in the same manner as the inside dummy gates 500. However, the outside dummy gate 600 is not formed inside the pad region PR, but formed to surround the pad region PR at a predetermined distance from the pad region PR. The first dummy metal contact 610 is formed on the outside dummy gate 600. Here, the first dummy metal contact 610 is formed to cut the silicon nitride film 406 for the self aligned contact and the trench stop silicon nitride film 412. That is, the silicon nitride film 406 for the self aligned contact and the trench stop silicon nitride film 412 are completely isolated from the peripheral regions adjacent to the pad region PR by the first dummy metal contact 610.

In addition, a width of the outside dummy gate 600 ranges from 0.3 to 1.0 μm. An interval between the outside dummy gate 600 and the inside of the pad region PR ranges from 2.0 to 5.0 μm. The width and position of the outside dummy gate 600 can be appropriately controlled according to a height of the pad structure, composition of interlayer materials, and a size of the pad.

A width of the first dummy metal contact 610 ranges from 0.2 to 0.4 μm. The first dummy metal contact 610 is formed in a line shape on the outside dummy gate 600, and also formed to surround the pad region PR outside the pad region PR. The first dummy metal contact 610 is opened on the outside dummy gate 600. The silicon nitride film 406 for the self aligned contact and the trench stop silicon nitride film 412 are cut to be completely isolated at the inside and outside of the pad region PR by the first dummy metal contact 610.

As described above, in accordance with the present invention, in order to prevent and buffer the stress of the silicon nitride film 406 for the self aligned contact and the trench stop silicon nitride film 412, the inside dummy gates 500 having the concentric square structure are formed inside the pad region PR, and the outside dummy gate 600 and the first dummy metal contact 610 are formed to surround the pad region PR outside the pad region PR. The silicon nitride film 406 for the self aligned contact and the trench stop silicon nitride film 412 are cut by the first dummy metal contact 610. That is, the silicon nitride film 406 for the self aligned contact and the trench stop silicon nitride film 412 are completely isolated at the inside and outside of the pad region PR. Therefore, the thermal stress and the mechanical stress applied to the nitride films 406 and 412 formed at the inside and outside of the pad region PR are blocked by the first dummy metal contact 610 outside the pad region PR, and thus not transmitted to the inside and outside of the pad region PR. In accordance with the present invention, the stress generated in the silicon nitride film 406 for the self aligned contact and the trench stop silicon nitride film 412 is prevented and buffered by using the inside dummy gates 500 inside the pad region PR and the outside dummy gate 600 and the first dummy metal contact 610 outside the pad region PR.

Figure 8:
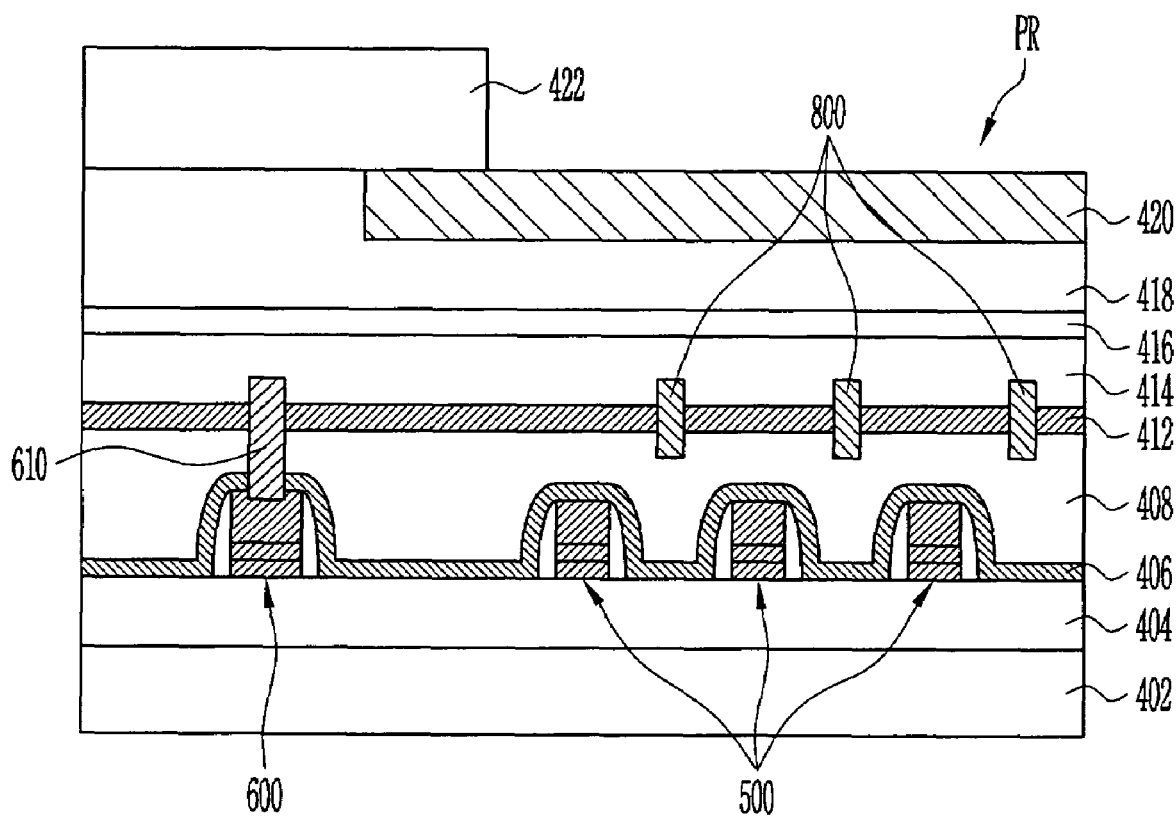
FIG. 8 is a partial cross-sectional diagram illustrating a semiconductor device having a pad structure for preventing and buffering a stress of an insulation film in accordance with a third embodiment of the present invention.

FIG. 8 is a partial cross-sectional diagram illustrating a semiconductor device having a pad structure for preventing and buffering a stress of an insulation film in accordance with a third embodiment of the present invention.

As depicted in FIG. 8, the pad structure of the semiconductor device includes first inside dummy metal layers 800 formed inside the pad region PR in addition to the pad structure of the second embodiment. The plurality of first inside dummy metal layers orthogonal to each other in the horizontal and vertical directions form a mesh shape or a concentric square structure. The trench stop silicon nitride film 412 is divided into a plurality of strips by the first inside dummy metal layers 800. The mesh shape can be a triangle, a square or a polygon according to the shapes of the first inside dummy metal layers 800.

The first inside dummy metal layers 800 are formed according to a general process for forming a first metal layer. However, the first inside dummy metal layers 800 are formed inside the pad region PR. In addition, the first inside dummy metal layers 800 are formed on the field oxide film 404 on which an active element has not been formed. A width of the first inside dummy metal layers 800 ranges from 0.2 to 1.0 μcm. An interval between the meshes of the first inside dummy metal layers 800 ranges from 2.0 to 5.0 μm. The meshes of the first inside dummy metal layers 800 are formed in the shape of 5 to 20 squares or triangles in the horizontal or vertical direction. The edges of the first inside dummy metal layers 800 can be aligned in a row in parallel to the edges of the pad region PR in the vertical direction. The first inside dummy metal layers 800 efficiently divide the trench stop silicon nitride film 412 into the plurality of strips, thereby preventing and buffering the thermal stress and the mechanical stress applied to the pad region PR. The first inside dummy metal layers 800 can be appropriately changed according to a width of the pad and constitution of the pad structure.

In accordance with the present invention, in order to prevent and buffer the stress of the trench stop silicon nitride film 412, the first inside dummy metal layers 800 having the mesh shape or the concentric square structure are formed inside the pad region PR. The first inside dummy metal layers 800 cut the trench stop silicon nitride film 412 into the plurality of strips inside the pad region PR. In addition, the trench stop silicon nitride film 412 is completely isolated at the inside and outside of the pad region PR. As a result, the stress is prevented from being transmitted to the trench stop silicon nitride film 412 formed in another region of the device.

Moreover, the first inside dummy metal layers 800 are formed with the inside dummy gates 500 of the first embodiment and the outside dummy gate 600 and the first dummy metal contact 610 of the second embodiment, thereby preventing and buffering the thermal stress and the mechanical stress of the silicon nitride film 406 for the self aligned contact and the trench stop silicon nitride film 412 in the whole semiconductor device.

On the other hand, the first inside dummy metal layers 800 are formed at the upper portions of the inside dummy gates 500. So as to prevent a parasitic capacitance from being generated between the first inside dummy metal layers 800 and the inside dummy gates 500, when the first inside dummy metal layers 800 have the concentric square structure, the inside dummy gates 500 has the concentric square structure. Preferably, the first inside dummy metal layers 800 are positioned between the inside dummy gates 500 not to overlap with the inside dummy gates 500 in the up/down direction. In addition, when the first inside dummy metal layers 800 are formed in the mesh shape, the inside dummy gates 500 are formed in the shape of a plurality of islands. Preferably, each of the island-shaped inside dummy gates 500 is inserted into the mesh not to overlap with the first inside dummy metal layers 800. Here, an interval between the inside dummy gates 500 and the first inside dummy metal layers 800 ranges from 0.5 to 3.0 μm.

Figure 9:
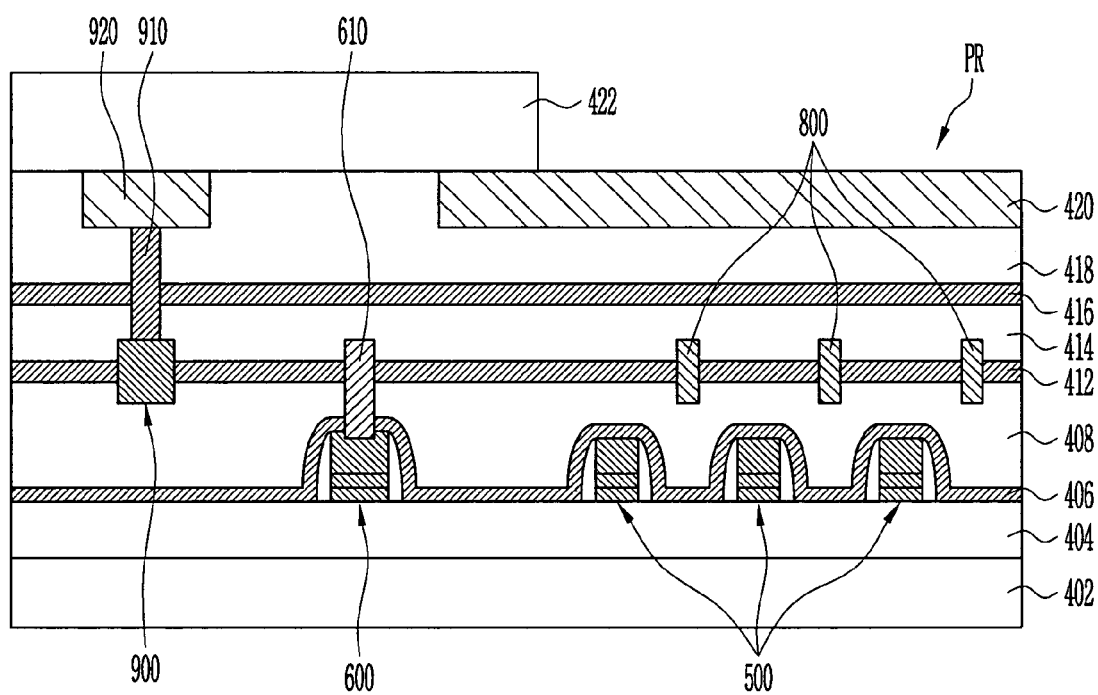
FIG. 9 is a partial cross-sectional diagram illustrating a semiconductor device having a pad structure for preventing and buffering a stress of an insulation film in accordance with a fourth embodiment of the present invention.

FIG. 9 is a partial cross-sectional diagram illustrating a semiconductor device having a pad structure for preventing and buffering a stress of an insulation film in accordance with a fourth embodiment of the present invention.

Referring to FIG. 9, the pad structure of the semiconductor device includes a first outside dummy metal layer 900 formed outside the pad region PR, and a second dummy metal contact 910 formed on the first outside dummy metal layer 900 in addition to the first inside dummy metal layers 800 of the third embodiment. In addition, the pad structure further includes a second dummy metal layer 920 formed on the second dummy metal contact 910. The second dummy metal layer 920 is formed on the field oxide film 404 outside the pad region PR. The pad structure may include the inside dummy gates 500 having the concentric square structure of the first embodiment. Furthermore, the pad structure may include the outside dummy gate 600, and the first dummy metal contact 610 formed on the outside dummy gate 600 of the second embodiment.

The first outside dummy metal layer 900 is formed simultaneously with the first inside dummy metal layers 800 according to the method for manufacturing the semiconductor device in the same manner as the first inside dummy metal layers 800. The first outside dummy metal layer 900 is formed at a width of 0.5 to 1.0 μm to surround the pad region PR.

The second dummy metal contact 910 is formed in a line shape on the first outside dummy metal layer 900. A width of the second dummy metal contact 910 ranges from 0.2 to 0.5 μm. In addition, the second dummy metal contact 910 is formed through the second metal contact stop silicon nitride film 416. Accordingly, the second metal contact stop silicon nitride film 416 of the semiconductor device is completely isolated and cut at the inside and outside of the pad region PR by the second dummy metal contact 910. On the other hand, when the first dummy metal contact 610 is formed, the second dummy metal contact 910 is formed at an interval of 1.0 to 5.0 μm from the first dummy metal contact 610.

The second dummy metal layer 920 is formed in a line shape on the second dummy metal contact 910. Here, the second dummy metal layer 920 is formed to support the second dummy metal contact 910. A width of the second dummy metal layer 920 ranges from 0.5 to 1.0 μm. An interval between the second dummy metal layer 920 and the adjacent second metal layer 420 in the semiconductor device ranges from 3.0 to 10.0 μm.

As described above, in accordance with the present invention, in order to prevent and buffer the stress of the second metal contact stop silicon nitride film 416, the second dummy metal contact 910 is formed in a line shape to surround the pad region PR. The second dummy metal contact 910 cuts the second metal contact stop silicon nitride film 416 outside the pad region PR. Therefore, the second metal contact stop silicon nitride film 416 of the semiconductor device is completely isolated and cut at the inside and outside of the pad region PR. As a result, the thermal or mechanical stress transmitted to the second metal contact stop silicon nitride film 416 through the pad region PR does not actually influence the second metal contact stop silicon nitride film 416 in the semiconductor device.

As discussed earlier, in accordance with the present invention, the thermal stress and the mechanical stress generated in the silicon nitride film for the self aligned contact and the trench stop silicon nitride film of the semiconductor device can be remarkably relieved, and lifting of the silicon nitride films of the semiconductor device can be prevented, by forming the inside dummy gates inside the pad region and the outside dummy gate and the first dummy metal contact outside the pad region.

In accordance with the present invention, the stress of the trench stop silicon nitride film can be prevented and buffered in the back-end process of the semiconductor device, by forming inside the pad region the first inside dummy metal layers for isolating and cutting the trench stop silicon nitride film at the inside and outside of the pad region by dividing the trench stop silicon nitride film into the plurality of strips.

In accordance with the present invention, the stress of the trench stop silicon nitride film can be prevented and buffered in the back-end process of the semiconductor device, by forming the second dummy metal layer for surrounding the pad region outside the pad region, and isolating and cutting the trench stop silicon nitride film at the inside and outside of the pad region.

In accordance with the present invention, the stress of the second metal contact stop silicon nitride film can be prevented and buffered in the back-end process of the semiconductor device, by forming the second dummy metal contact for surrounding the pad region outside the pad region, and isolating and cutting the second metal contact stop silicon nitride film at the inside and outside of the pad region.

In accordance with the present invention, reliability of the semiconductor device can be improved by providing the pad structure for preventing and buffering the stress of the silicon nitride film during the bonding process.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A semiconductor device, comprising:
   a semiconductor substrate;
   a field oxide film on the semiconductor substrate;
   a plurality of inside dummy gates formed on the field oxide film under a pad region;
   an outside dummy gate for surrounding the pad region at a predetermined interval from the pad region outside the pad region;
   a silicon nitride film formed on an entire structure including the plurality of inside dummy gates;
   an insulation film formed over an entire structure including the silicon nitride film;
   a metal layer formed over the insulating film for forming a pad at the pad region; and
   a protection layer formed on a portion of the metal layer, wherein the pad region of the metal layer is exposed, and the exposed metal layer is used as the pad to supply a voltage from outside of the semiconductor device to inside of the semiconductor device, according to a wire bonding process.

2. The semiconductor device of claim 1, wherein the inside dummy gates are formed in the shape of a plurality of concentric squares or a plurality of islands.

3. The semiconductor device of claim 1, wherein a horizontal interval between the inside dummy gates and the edges of the pad region ranges from 0.3 to 3.0 µm.

4. The semiconductor device of claim 1, wherein a width of the inside dummy gates ranges from 0.3 to 3.0 µm.

5. The semiconductor device of claim 1, wherein an interval between the inside dummy gates ranges from 0.3 to 3.0 µm.

6. A semiconductor device, comprising:
   a semiconductor substrate;
   a lower structure formed on the semiconductor substrate;
   an insulation film formed over an entire structure including the lower structure;
   a metal layer formed over the insulating film for forming a pad at a pad region;
   a plurality of inside dummy gates formed under the pad region;
   an outside dummy gate for surrounding the pad region at a predetermined interval from the pad region outside the pad region; and,
   a silicon nitride film formed on an entire structure including the plurality of inside dummy gates.

7. The semiconductor device of claim 6, wherein a width of the outside dummy gate ranges from 0.3 to 1.0 µm.

8. The semiconductor device of claim 6, wherein a horizontal interval between the outside dummy gate and the pad region ranges from 2.0 to 5.0 µm.

9. The semiconductor device of claim 6, further comprising a first dummy metal contact etched in a line shape on the outside dummy gate outside the pad region.

10. The semiconductor device of claim 9, wherein a width of the first dummy metal contact ranges from 0.2 to 0.4 µm.

11. The semiconductor device of claim 9, wherein the first dummy metal contact is formed on the outside dummy gate.

12. The semiconductor device of claim 1, wherein a width of the outside dummy gate ranges from 0.3 to 1.0 µm.

13. The semiconductor device of claim 1, wherein a horizontal interval between the outside dummy gate and the pad region ranges from 2.0 to 5.0 µm.

14. The semiconductor device of claim 1, further comprising a first dummy metal contact etched in a line shape on the outside dummy gate outside the pad region.

15. The semiconductor device of claim 14, wherein a width of the first dummy metal contact ranges from 0.2 to 0.4 µm.

16. The semiconductor device of claim 14, wherein the first dummy metal contact is formed on the outside dummy gate.

* * * * *